United States Patent [19]

Fletcher

[11] 4,415,817
[45] Nov. 15, 1983

[54] BIPOLAR LOGIC GATE INCLUDING CIRCUITRY TO PREVENT TURN-OFF AND DEEP SATURATION OF PULL-DOWN TRANSISTOR

[75] Inventor: Thomas D. Fletcher, Provo, Utah

[73] Assignee: Signetics Corporation, Sunnyvale, Calif.

[21] Appl. No.: 309,756

[22] Filed: Oct. 8, 1981

[51] Int. Cl.³ .................. H03K 17/04; H03K 17/62; H03K 19/088; H03K 19/084
[52] U.S. Cl. .................. 307/454; 307/300; 307/456; 307/458; 307/563
[58] Field of Search ............... 307/454–458, 307/460, 466, 443, 445, 446, 549, 300, 551, 562, 563, 317 A

[56] References Cited

U.S. PATENT DOCUMENTS

| | | | |
|---|---|---|---|
| 3,105,159 | 9/1963 | Ditkofsky | 307/446 |
| 3,571,616 | 3/1971 | Andrews | 307/456 |
| 3,614,467 | 8/1971 | Tu | 307/456 X |
| 3,631,260 | 12/1971 | Yoshino | 307/274 X |
| 3,699,355 | 8/1972 | Madrazo et al. | 307/456 |
| 3,742,250 | 6/1973 | Kan | 307/563 X |
| 3,751,680 | 8/1973 | Hodges | 307/563 X |
| 3,962,590 | 6/1976 | Kane et al. | 307/317 A X |
| 3,999,080 | 12/1976 | Weathersby, Jr. et al. | 307/300 X |
| 4,107,547 | 8/1978 | Ishino | 307/203 |

Primary Examiner—Stanley D. Miller
Assistant Examiner—David R. Hudspeth
Attorney, Agent, or Firm—R. J. Meetin; R. T. Mayer; T. A. Briody

[57] ABSTRACT

A logic circuit in which (1) a first bipolar transistor has a base, an emitter, and a collector coupled to a voltage/current source, and (2) a second bipolar transistor has a base coupled to the emitter of the first transistor, an emitter coupled to a constant voltage source, and a collector coupled to the voltage/current source contains operational control circuitry for preventing the second transistor from either turning off or normally going into deep saturation. Each transistor is typically an NPN device. The operational control circuitry may then comprise (1) first circuitry for providing current from the voltage/current source in a single current-flow direction to the collector of the second transistor and (2) second circuitry for providing current from the first circuitry in a single current-flow direction to the base of the second transistor. Optimally, the first circuitry prevents the second transistor from ever going into deep saturation.

18 Claims, 11 Drawing Figures

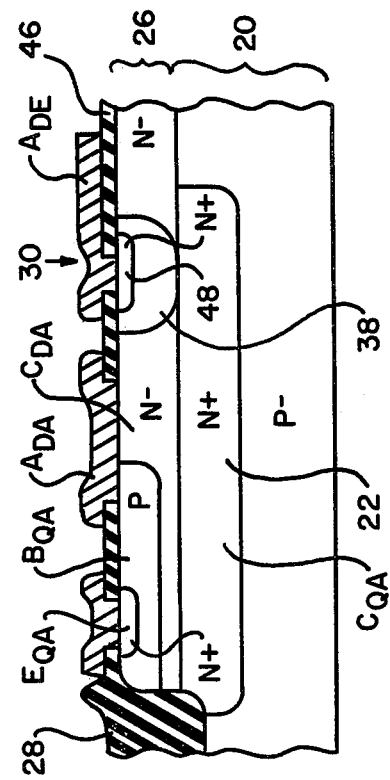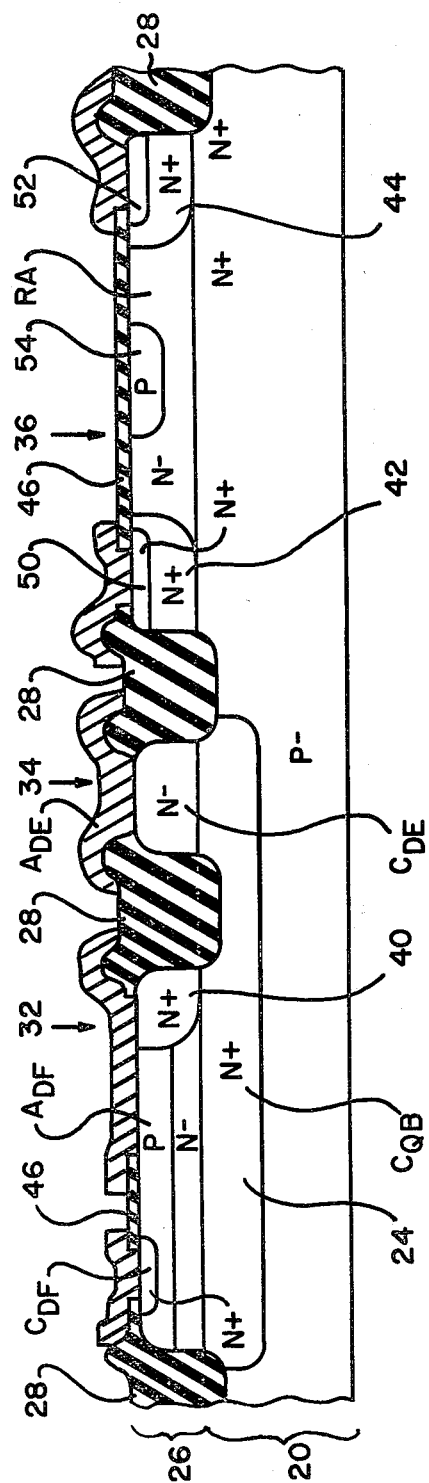
Fig. 10A
Fig. 10B

BIPOLAR LOGIC GATE INCLUDING CIRCUITRY TO PREVENT TURN-OFF AND DEEP SATURATION OF PULL-DOWN TRANSISTOR

FIELD OF USE

This invention relates generally to semiconductor digital logic circuits and more particularly to bipolar logic gates containing Schottky diodes.

BACKGROUND ART

In designing a digital logic gate in a semiconductor integrated circuit, an important objective is to reduce the gate propagation delay. This is the average time needed for an output signal of the gate to switch from a desired logical low or "0" value to a desired logical high or "1" value and vice versa in response to a corresponding change in an input signal to the gate. Such a gate typically consists of a switching transistor in combination with a mechanism to pull the output signal rapidly down to logical "0" and/or a mechanism to pull the output signal rapidly up to logical "1".

Referring to the drawings, FIG. 1 illustrates a conventional inverting logic gate of the type briefly mentioned by H. Ishino in U.S. Pat. No. 4,107,547. This transistor-transistor logic (TTL) inverter receives an input voltage $V_{IN}$ at the base of a bipolar NPN transistor QA and provides an output voltage $V_{OUT}$ at the collector of another bipolar NPN transistor QB having its emitter grounded and its base connected to the emitter of transistor QA. The collector of transistor QA is resistively coupled to a voltage/current source $V_{CC}$ and is coupled through a conventional PN diode DD to the collector of transistor QB.

Transistor QA or QB is in the on or conductive state when its base-to-emitter junction voltage $V_{BEQA}$ or $V_{BEQB}$ equals a PN diode-drop voltage termed a "$V_{BE}$" and is in the off or substantially non-conductive state when voltage $V_{BEQA}$ or $V_{BEQB}$ is less than 1 $V_{BE}$. Accordingly, transistors QA and QB both turn on as input voltage $V_{IN}$ is raised from a logical "0" of less than 1 $V_{BE}$ to a logical "1" of 2 $V_{BE}$. Both transistors QA and QB go into "deep" saturation. This means that the base-collector junction of transistor QA or QB is sufficiently forward biased so as to be fully conductive. As transistor QB saturates, it draws progressively more current from source $V_{CC}$ to actively pull output voltage $V_{OUT}$ down to a logical "0" near 0 volt. When voltage $V_{IN}$ is brought back down to its logical "0", transistors QA and QB both turn off. Depending on the load which voltage $V_{OUT}$ is applied to, diode DD may be conductive. If so, a PN diode-drop voltage of 1 $V_{BE}$ occurs across diode DD, and voltage $V_{OUT}$ rises up to a logical "1" of at least 1 $V_{BE}$ below $V_{CC}$.

A significant drawback of this inverter is that there is a relatively large output voltage swing since transistor QB turns off when voltage $V_{OUT}$ rises to logical "1". This voltage swing limits the output switching speed. Another disadvantage is that transistors QA and QB are initially both in deep saturation as voltage $V_{IN}$ is switched from logical "1" to logical "0", and their bases therefore contain large amounts of stored charge. In transistors not made by gold-doped processes, these charges take relatively large amounts of time to flow to ground compared to the input switching time. As a result, the low-to-high output switching time is limited by the time needed to discharge transistors QA and QB from deep saturation. Even with gold-doped transistors, the average propagation delay is usually about 3 nanoseconds.

Another conventional inverter as disclosed by J. Kane et al. in U.S. Pat. No. 3,962,590 is shown in FIG. 2. This TTL inverter contains all of the elements of FIG. 1 plus an NPN bipolar transistor QC having its collector connected to source $V_{CC}$ and its base and emitter coupled, respectively, between the collector of transistor QA and the anode of diode DD. A Schottky diode DA connected between the base and collector of transistor QA Schottky clamps it. Transistor QB is similarly Schottky clamped with a Schottky diode DB.

Although Kane et al. do not describe the switching operation of this inverter in detail, I understand it to operate as follows: As voltage $V_{In}$ is raised to a logical "1" of 2 $V_{BE}$, transistors QA and QB both turn on and saturate. Because they are Schottky clamped, neither normally goes into deep saturation. Instead, both go into "low" saturation where their base-collector junctions are forward biased, but below the normal fully conductive level. This occurs because diodes DA and DB become conductive and clamp the voltages across the base-collector junctions of transistors QA and QB at a Schottky diode-drop voltage which may be termed as "$V_{SH}$" and is normally slightly less than 1 $V_{BE}$. This clamped value of 1 $V_{SH}$ is usually not high enough to allow either of these base-collector junctions to become fully conductive in the forward direction. As transistor QB turns on, it actively pulls voltage $V_{OUT}$ down. Meanwhile, transistor QC turns off. When voltage $V_{In}$ is brought back down to a logical "0" of 1 $V_{BE}$ or lower, transistors QA and QB turn off. Transistor QC turns on to actively pull voltage $V_{OUT}$ up to a logical "1" of at least 2 $V_{BE}$ below $V_{CC}$ if diode DD is conductive.

By having transistors QA and QB Schottky clamped, less charge must be dissipated from their bases as voltage $V_{IN}$ switches from logical "1" to logical "0". This reduces the low-to-high output switching time compared to that of FIG. 1. However, diode DA or DB may not always keep its transistor QA or QB from going into deep saturation. Because of processing variations from transistor to transistor and different doping levels in the collector and base compared to the emitter and base, the base-collector junction may become conductively forward biased at a voltage less than 1 $V_{BE}$. Sometimes the base-collector junction becomes conductively forward biased at a voltage of 1 $V_{SH}$ or less. A Schottky-clamped transistor may also go into deep saturation if its Schottky diode is improperly designed or is operated at a high current level. Moreover, there is a relatively sharp bend in the curve of collector-to-emitter voltage as a function of collector current that defines the low and deep saturation regions. In short, a Schottky-clamped transistor may still accumulate a moderately large amount of charge. In addition, the output voltage swing is again relatively large since transistor QB turns off during switching operation. The average propagation delay for a gate such as that of FIG. 2 is usually about 2 nanoseconds.

DISCLOSURE OF THE INVENTION

In accordance with the invention, a logic circuit with (1) a first bipolar transistor having a base, an emitter, and a collector coupled to a voltage/current source, and (2) a second bipolar transistor having a base coupled to the emitter of the first transistor, an emitter coupled to a constant voltage source, and a collector coupled to the voltage/current source contains operational control circuitry for preventing the second transistor from either turning substantially off or normally going into deep saturation.

In this manner, the second transistor which actively pulls an output signal taken from its collector down to logical "0" remains continuously on during switching operation. The resulting output voltage swing is less than that of pull-down/pull-up transistors that switch on and off in comparable prior art logic gates. This reduces the average propagation delay of the present circuit.

Each transistor is normally an NPN device. The operational control circuitry then preferably comprises (1) first circuitry for providing current from the voltage/current source in a single current-flow direction to the collector of the second transistor and (2) second circuitry for providing current from the first circuitry in a single current-flow direction to the base of the second transistor. Optimally, the first circuitry completely prevents the second transistor from ever going into deep saturation where its base-collector junction is fully conductive in the forward direction. This reduces the average propagation delay even further since no time is lost in dissipating the large amount of charge that accumulates in a deeply saturated transistor.

The first circuitry typically contains a first diode, desirably a Schottky diode, coupled from the collector of the first transistor to the collector of the second transistor. The first circuitry then further includes clamping circuitry for preventing the first transistor from normally operating in deep saturation. This may be accomplished by Schottky clamping the first transistor. Alternatively, a Schottky diode is coupled in parallel with the first diode between the base of the first transistor and the collector of the second transistor. This alternative arrangement prevents the first transistor from saturating at all by clamping its base and collector at nearly the same voltage.

The second circuitry typically contains a second diode, desirably a PN diode, coupled from the collector of the second transistor to its base. This is the opposite direction to which a Schottky diode would be connected for Schottky clamping the second transistor.

The logic circuit normally functions as an inverter gate with an input signal applied to the base of the first transistor and an output signal of the opposite polarity taken from the collector of the second transistor. By adding (M−1) additional first NPN transistors in parallel with the first transistor, the logic circuit is converted to a NOR gate. Each additional first transistor has a base for receiving an input signal, an emitter coupled to the base of the second transistor, and a collector coupled to the voltage/current source. In another variation, the logic circuit is converted to a NAND gate by adding a plurality of input diodes coupled by their anodes to the base of the first transistor.

An advantage of the present logic circuit is that its average propagation delay is about 1 nanosecond. This is less than that of otherwise comparable prior art devices. Moreover, the noise margin for both high-to-low and low-to-high switching is an adequate value of about 0.5 volt in a principal embodiment. Because of the inclusion of Schottky diodes, the present logic circuit also performs very well over the temperature range of −55° C. to 150° C. An inverter employing the present logic circuit occupies as little as 4800 microns$^2$ which is smaller than prior art TTL and emitter-coupled logic (ECL) inverters. The present inverter also requires less power than conventional ECL inverters.

The logic circuit of the invention can be used as a building block in the logic portions of numerous types of integrated circuits. It has a high fan-out capability and is generally compatible with TTL systems.

BRIEF DESCRIPTION OF THE DRAWINGS

FIGS. 10A and 10B are cross-sectional views of portions of the inverter shown in FIG. 9.

Like reference symbols are employed in the drawings and in the description of the preferred embodiments to represent the same item or items.

DESCRIPTION OF THE PREFERRED EMBODIMENTS

Figure 1:
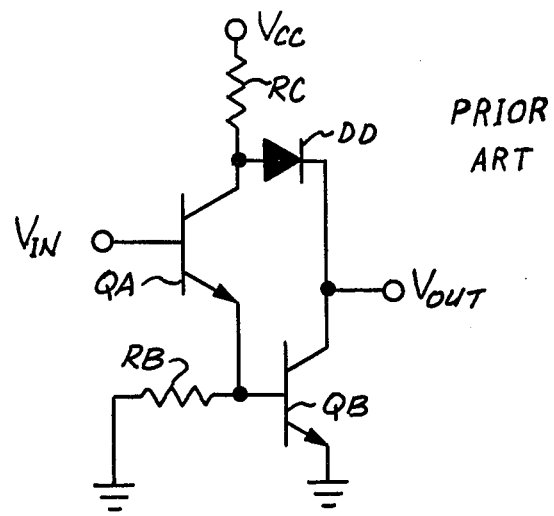
FIGS. 1 and 2 are circuit diagrams of prior art inverting logic gates.
Figure 2:
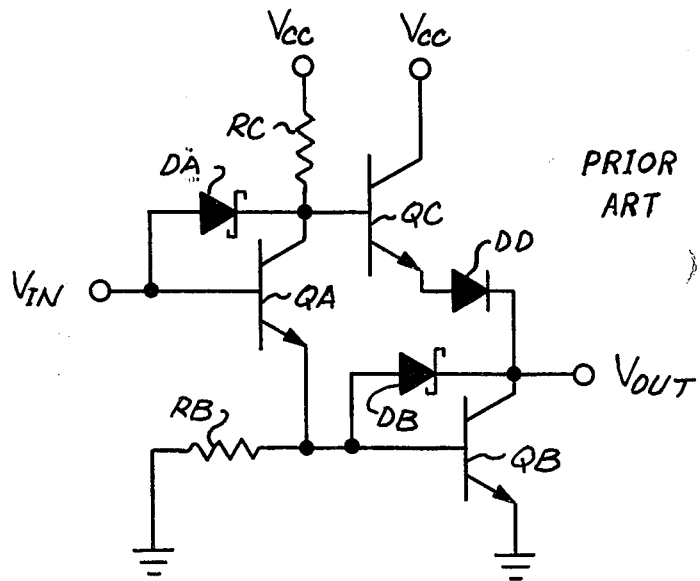
Figure 3:
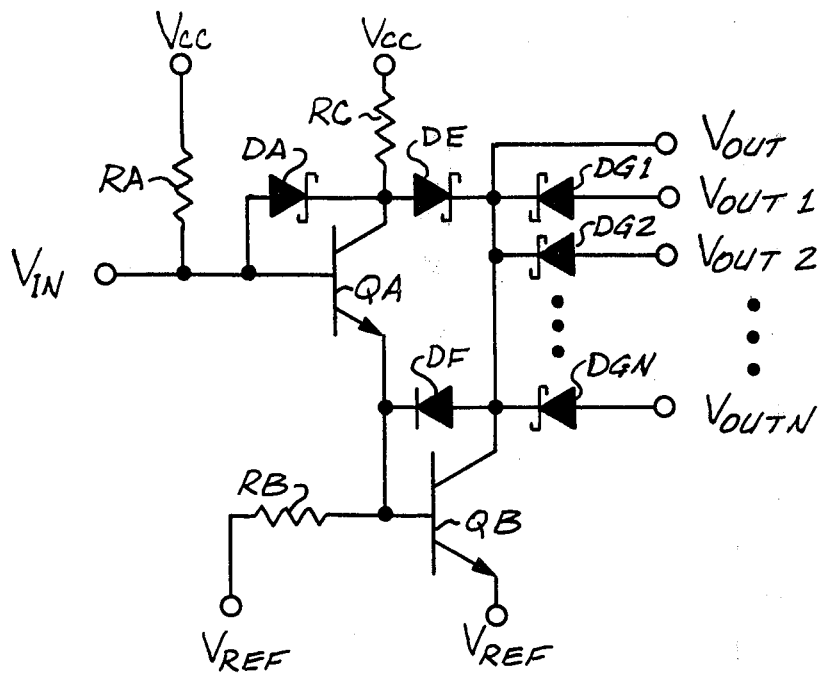
FIG. 3 is a circuit diagram of an embodiment of an inverting logic gate according to the invention.

Referring to the drawings, FIG. 3 illustrates an inverting logic gate of very high switching speed. Input voltage $V_{IN}$ is applied to the base of silicon NPN bipolar transistor QA whose base and collector are tied to voltage/current source $V_{CC}$ through a resistor RA and a resistor RC, respectively. Aluminum-silicon Schottky diode DA is connected between the base and collector of transistor QA to prevent its base-collector junction from being forward biased more than 1 $V_{SH}$ which is 0.4–0.7 volts depending on the diode current and typically is 0.5 volt. The base-collector junction of transistor QA normally does not become fully conductive until its base-to-collector voltage $V_{BCQA}$ exceeds 1 $V_{SH}$. Accordingly, diode DA normally prevents transistor QA from going into deep saturation.

An aluminum-silicon Schottky diode DE is connected through its anode and cathode to the collectors of transistors QA and QB, respectively. The collector of transistor QB is also connected to the anode of a silicon PN diode DF whose cathode is connected to the base of transistor QB. Its base is further connected to the emitter of transistor QA and through a resistor RB to a source $V_{REF}$ of a constant reference voltage. The emitter of transistor QB is connected to constant voltage source $V_{REF}$ which preferably is ground potential.

Output voltage $V_{OUT}$ can be taken directly from the collector of transistor QB. Preferably, a series of N output voltages $V_{OUT1}, V_{OUT2}, \ldots V_{OUTN}$ are taken from the anodes of N corresponding aluminum-silicon output Schottky diodes DG1, DG2, ... DGN, respectively, whose cathodes connect to the collector of transistor QB. This arrangement provides both a high fan-out and suitable input voltage levels for additional logic gates connected to the inverter of FIG. 3 for receiving voltages $V_{OUT1} - V_{OUTN}$.

The inverter of FIG. 3 operates as follows: In the situation where voltage $V_{REF}$ is ground potential, the desired logical "1" input value for voltage $V_{In}$ is a threshold value of 2 $V_{BE}$. For silicon bipolar transistors and silicon PN diodes, 1 $V_{BE}$ is 0.6–1.0 volt depending on the current and typically equals 0.8 volt. The desired logical "1" input value exceeds the desired logical "0" input value for voltage $V_{IN}$ by a suitable amount which may be termed the logical "0" input noise margin. To facilitate connection of the present inverter to another logic circuit having the same input/output characteristics as the present inverter, the logical "0" input noise margin preferably equals the corresponding logical "0" output noise margin which is 1 $V_{SH}$ as discussed below. Accordingly, the desired logical "0" input value is 2 $V_{BE}-V_{SH}$. The desired output logic levels are the same for each voltage $V_{OUTJ}$ where J varies from 1 to N. That is, the desired logical "1" output value is 2 $V_{BE}$ (with a suitable logical "1" output noise margin); the desired logical "0" output value is 2 $V_{BE}-V_{SH}$.

When voltage $V_{IN}$ is raised from logical "0" to logical "1", transistor QA turns on. This establishes a current path from source $V_{CC}$ through resistor RC and transistor QA to the base of transistor QB that acts to pull its base voltage up. Transistor QB which was previously on turns on harder. Transistor QA draws current from source $V_{CC}$ to cause a greater voltage drop across resistor RC. The voltage at the anode of diode DE which was previously conductive drops accordingly. Nonetheless, diode DE remains conductive. Diode DA becomes conductive to Schottky clamp transistor QA.

The voltage at the base of transistor QB is $V_{BEQB}$ and equals 1 $V_{BE}$. With $V_{DDA}$ and $V_{DDE}$ being the conductive voltages across diodes DA and DE, respectively, the voltage at the collector of transistor QB is $V_{BEQB}+V_{BEQA}-V_{DDA}-V_{DDE}$ and equals 2 $V_{BE}-2 V_{SH}$ here. The base-to-collector voltage $V_{BCQB}$ for transistor QB is therefore 1 $V_{BE}-(2 V_{BE}-2 V_{SH})$ which is 2 $V_{SH}-V_{BE}$ or about 0.2 volt. This is significantly below the forward voltage needed to make the base-collector junction of transistor QB fully conductive. Transistor QB cannot deeply saturate. It operation is limited to its low saturation range. In effect diode DE in combination with transistor QA and its Schottky clamp DA act to clamp transistor QB well out of deep saturation. This substantially reduces the low-to-high output switching time when voltage $V_{IN}$ is later brought back down to its logical "0" since the charge that must be dissipated from the base of transistor QB is substantially reduced because it does not approach deep saturation.

During low-to-high input switching, the collector-to-emitter resistance of transistor QB decreases when it turns on harder. This actively pulls each output voltage $V_{OUTJ}$ down to its logical "0" to decrease the high-to-low output switching time. The voltage $V_{DDGJ}$ across each diode DDj is 1 $V_{SH}$ while voltage $V_{OUTJ}$ equals $V_{DDGJ}$ plus the collector voltage of transistor QB. As a result, voltage $V_{OUTJ}$ reaches the desired logical "0" output value of 2 $V_{BE}-V_{SH}$. Since the desired output logical "1" is 2 $V_{BE}$, the logical "0" output noise margin is 1 $V_{SH}$.

The voltage across diode DF goes to $-V_{BCQB}$ which is 1 $V_{BE}-2 V_{SH}$ or about $-0.2$ volt when voltage $V_{IN}$ reaches its logical "1". Diode DF is reverse biased and therefore inactive at this point.

As voltage $V_{IN}$ is returned to logical "0", transistor QA turns off. Likewise, diode DA becomes non-conductive. The voltage at the base of transistor QA decreases as it moves toward the non-conductive state. However, transistor QB cannot turn off. As the base voltage for transistor QB drops, diode DF becomes forward biased and finally conductive until another current path from source $V_{CC}$ to the base of transistor QB is established through resistor RC by way of diode DE which remains conductive and diode DF. The current through diode DF to the base of transistor QB keeps it on.

The base voltage for transistor QB is $V_{BEQB}$ which again equals 1 $V_{BE}$. With $V_{DDF}$ being the voltage across diode DF when it is conductive, the collector voltage for transistor QB is $V_{BEQB}+V_{DDF}$ and equals 2 $V_{BE}$ here. Voltage $V_{BCQB}$ is therefore $-1 V_{BE}$ so that the base-collector junction of transistor QB is reversed biased and it operates in the linear range.

Were diode DF non-existent, there would be no alternative current path to the base of transistor QB to keep it on when voltage $V_{IN}$ drops to its logical "0". Thus diode DF prevents transistor QB from turning off. This decreases the voltage swing across transistor QB and in turn, reduces the average gate propagation delay.

During high-to-low input switching, each voltage $V_{OUTJ}$ moves upward as the collector-to-emitter resistance of transistor QB increases, causing the current through resistor RC to decrease. Voltage $V_{OUTJ}$ can rise as high as $V_{DDGJ}$ plus the collector voltage of transistor QB. This is 2 $V_{BE}+1 V_{SH}$. However, the desired logical "1" output level is 2 $V_{BE}$. Accordingly the inverter of FIG. 3 provides a logical "1" output signal of 2 $V_{BE}$ with a logical "1" output noise margin of 1 $V_{SH}$ (which is the same as the logical "0" output noise margin). The output voltage swing is the difference between the maximum and minimum values of voltage $V_{OUTJ}$ and here equals 2 $V_{BE}+V_{SH}-(2 V_{BE}-V_{SH})$ which is 2 $V_{SH}$ or about 1.0 volt.

Diode DF may be configured in any one of several ways. Preferably, diode DF consists of an NPN bipolar transistor in which its emitter serves as the cathode and its base is tied to its collector to serve as the anode. Alternatively, diode DF may be a conventional two-element diode having a P-type region as the anode and an N-type region as the cathode.

Figure 4:
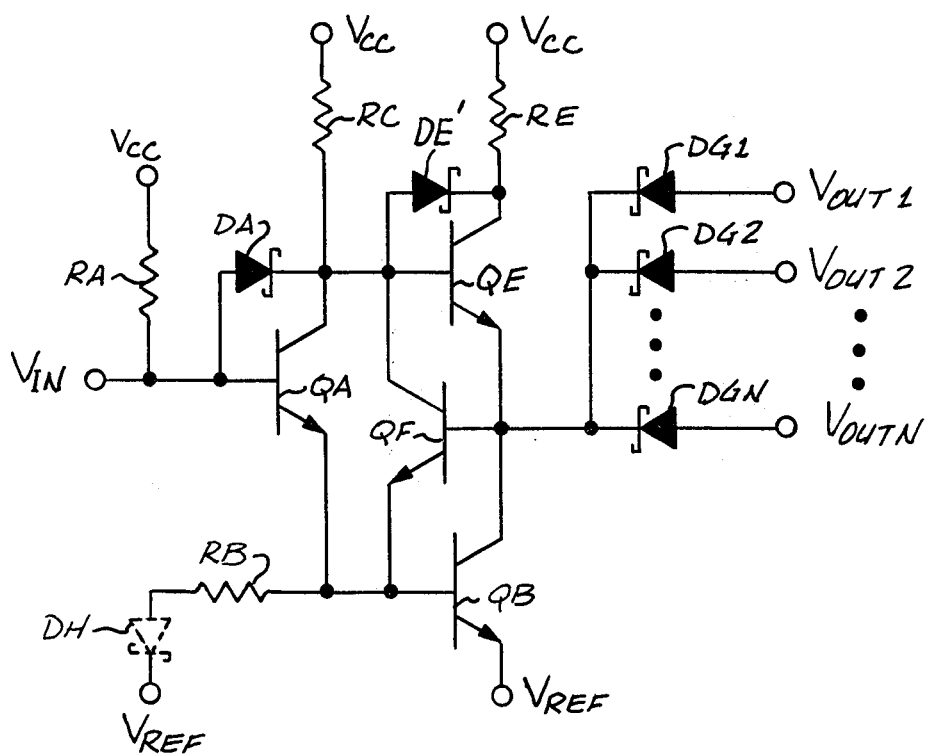
FIG. 4 is a circuit diagram of a variation of the inverter of FIG. 3.

Still further, diode DF may consist of the base-emitter junction of an NPN bipolar transistor QF. FIG. 4 shows a circuit diagram for such an inverter containing transistor QF in which its collector is tied in common with the collector of transistor QA through resistor RC to source $V_{CC}$. Insofar as transistor QF is concerned, the operation of the inverter of FIG. 4 is substantially the same as that described above for FIG. 3.

Diode DF may be replaced by a Schottky diode connected in the same manner as diode DF. Operation is basically the same as when diode DF is a PN diode except that the logical "1" output noise margin decreases slightly to 2 $V_{SH}-V_{BE}$ or about 0.2 volt. The output switching speed is slightly greater due to the resulting slightly smaller output voltage swing.

Even further, PN diode DF may have one or more additional diodes in series with it. In this case, operation is substantially the same as that described above for FIG. 3, except that the logical "1" output noise margin is greater. Where, for example, a single Schottky diode is connected in series with PN diode DF, the logical "1" output noise margin is 2 $V_{SH}$ or about 1.0 volt. The output switching speed should decrease slightly because of the greater output voltage swing but might increase due to less parasitic capacitance at the collector of transistor QB.

As long as diode DE is a Schottky diode, transistor QB never goes into deep saturation irrespective of whether diode DF is a PN diode, is replaced by a Schottky diode, or includes one or more other diodes in series with it. Voltage $V_{BCQB}$ goes no higher than 2 $V_{SH}-V_{BE}$ or about 0.2 volt so that the base-collector junction never becomes conductively forward biased.

In some applications, it may be desirable to substitute a PN diode for Schottky diode DE. In such a case, voltage $V_{BCQB}$ at input logical "1" drops to 1 $V_{SH}$. This is the condition that exists when a transistor is Schottky clamped. Accordingly, transistor QB is effectively Schottky clamped and normally does not go into deep saturation. The logical "1" output noise margin is a slightly higher value of 1 $V_{BE}$, resulting in a slightly higher propagation delay. Transistor QB otherwise operates in precisely the same manner as described above for FIG. 3. Where diode DF is also replaced by a Schottky diode or is in series with one or more other diodes, the logical "0" output noise margin is the same as that described above.

When diode DE is replaced with a PN diode it may be configured in any one of several ways. It may be a conventional two-element PN diode or an NPN bipolar transistor in which its emitter is the cathode and its base is connected to its collector to serve as the anode. Alternatively, the PN diode may consist of the base-emitter junction of an NPN bipolar transistor QE having its collector connected through a resistor RE to source $V_{CC}$ as shown in FIG. 4. Preferably, a Schottky diode DE' Schottky clamps transistor QE. Aside from the use of diode DE', the operation of the inverter of FIG. 4 with respect to transistor QE is otherwise the same as that described above for the case in which diode DE is replaced with a PN diode.

Table I below summarizes the operating characteristics of the preferred embodiment and the principal variations to it. The entries "SH" and "PN" for the category "DE" indicate the cases where diode DE is a Schottky diode or is replaced by a PN diode, respectively. Likewise, the entries "PN", "SH", and "PN+SH" for the category "DF" indicate the cases where diode DF is a PN diode, is replaced by a Schottky diode, or is in series with a Schottky diode, respectively.

TABLE I

| DE | DF | $V_{IN}$ | $V_{OUT}$ | $V_{BCQB}$ | NOISE MARGIN |
|---|---|---|---|---|---|
| SH | PN | 1 | 0 | $2V_{SH} - V_{BE}$ | $V_{SH}$ |
|  |  | 0 | 1 | $-V_{BE}$ | $V_{SH}$ |
| SH | SH | 1 | 0 | $2V_{SH} - V_{BE}$ | $V_{SH}$ |
|  |  | 0 | 1 | $-V_{SH}$ | $2V_{SH} - V_{BE}$ |
| SH | PN + SH | 1 | 0 | $2V_{SH} - V_{BE}$ | $V_{SH}$ |
|  |  | 0 | 1 | $-V_{BE} - V_{SH}$ | $2V_{SH}$ |
| PN | PN | 1 | 0 | $V_{SH}$ | $V_{BE}$ |
|  |  | 0 | 1 | $-V_{BE}$ | $V_{SH}$ |
| PN | SH | 1 | 0 | $V_{SH}$ | $V_{BE}$ |
|  |  | 0 | 1 | $-V_{SH}$ | $2V_{SH} - V_{BE}$ |
| PN | PN + SH | 1 | 0 | $V_{SH}$ | $V_{BE}$ |
|  |  | 0 | 1 | $-V_{BE} - V_{SH}$ | $2V_{SH}$ |

Referring again to FIG. 4, an aluminum-silicon Schottky diode DH is optionally connected between resistor RB and source $V_{REF}$. Diode DH in combination with resistor RB acts to turn off transistor QB in certain high-speed switching operations.

Figure 5:
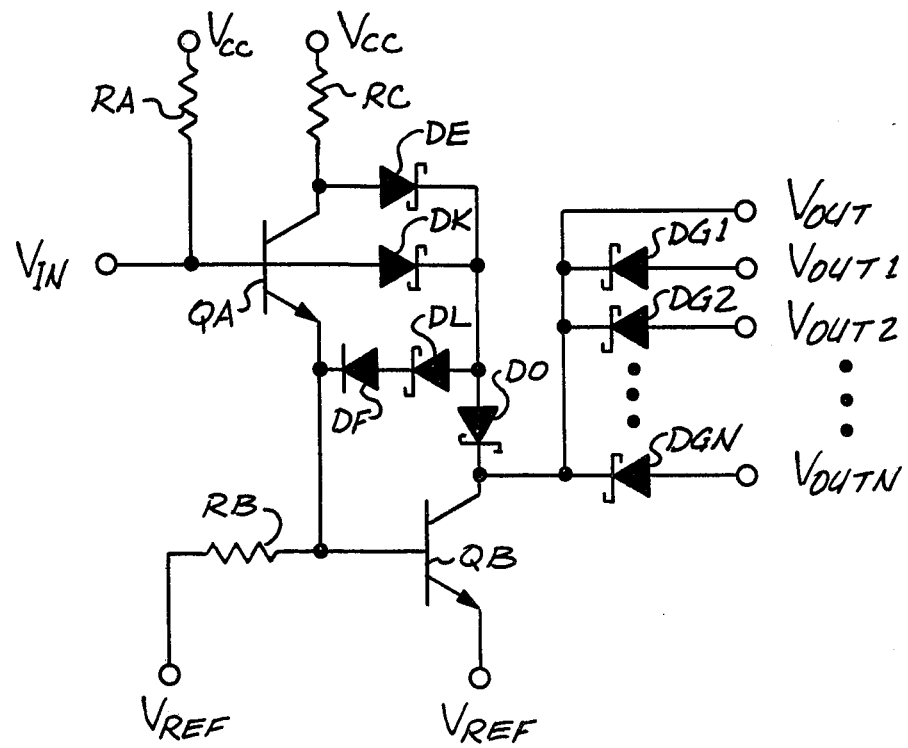
FIG. 5 is a circuit diagram of an embodiment of another inverting logic gate according to the invention.

FIG. 5 shows another inverting logic gate of very high switching speed. This inverter contains all the elements of FIG. 3 except that transistor QA is not Schottky clamped with diode DA. Instead, the base of transistor QA is connected to the anode of an aluminum-silicon Schottky diode DK whose cathode is connected to the cathode of diode DE. An aluminum-silicon Schottky diode DL is connected in series with diode DF. Another aluminum-silicon Schottky diode DO is connected by its anode to the anode of diode DL and by its cathode to the collector of transistor QB.

The inverter of FIG. 5 operates similarly to the inverter of FIG. 3. The input and output logical levels are the same. Transistor QB is continuously on and does not go into deep saturation. Diode DE is always conductive as long as power is supplied to the inverter.

When voltage $V_{IN}$ is brought to logical "1", transistor QA turns on. Current from source $V_{CC}$ flows through transistor QA to the base of transistor QB to turn it on harder. Diode DK becomes conductive while diode DO which was conductive remains conductive. Since diodes DE and DK are both conductive and have substantially the same voltage drop with proper design, base-to-collector voltage $V_{BCQA}$ for transistor QA is virtually zero. It is clamped totally out of saturation by diodes DE and DK. The voltage swing across transistor QA is less, causing the output switching speed to increase.

The collector voltage of transistor QB is $V_{BEQB} + V_{BEQA} - V_{DDK} - V_{DDO}$ which again equals $2 V_{BE} - 2 V_{SH}$ where $V_{DDK}$ and $V_{DDO}$ are the conductive voltages across diodes DK and DO respectively. Accordingly, voltage $V_{BCQB}$ is $2 V_{SH} - V_{BE}$ just as in the inverter of FIG. 3. Again, transistor QB cannot go into deep saturation. Its operation is limited to its low saturation range. In effect, diodes DK and DO in combination with transistor QA clamp transistor QB well out of deep saturation. Diodes DF and DL are reverse biased. As transistor QB turns on harder, it actively pulls each voltage $V_{OUTJ}$ down to its logical "0". The logical "0" output noise margin is again 1 $V_{SH}$.

When voltage $V_{IN}$ is returned to logical "0", transistor QA turns off and diode DK becomes non-conductive. As the base voltage for transistor QA drops, diodes DF and DL become conductive to establish an alternate current path from source $V_{CC}$ through them to the base of transistor QB. The current flowing through this path keeps transistor QB on. The collector voltage for transistor QB is $V_{BEQB} + V_{DDF} + V_{DDL} - V_{DDO}$ which again is 2 $V_{BE}$ where $V_{DDL}$ is the conductive voltage for diode DDL. As with FIG. 3, each voltage $V_{OUTJ}$ rises to its logical "1" of 2 $V_{BE}$ with a logical "1" output noise margin of 1 $V_{SH}$.

In short, the inverter of FIG. 5 provides a slightly greater switching speed than that of FIG. 3 at the cost of adding diodes DL and DO and using diode DK instead of diode DA.

Figure 6:
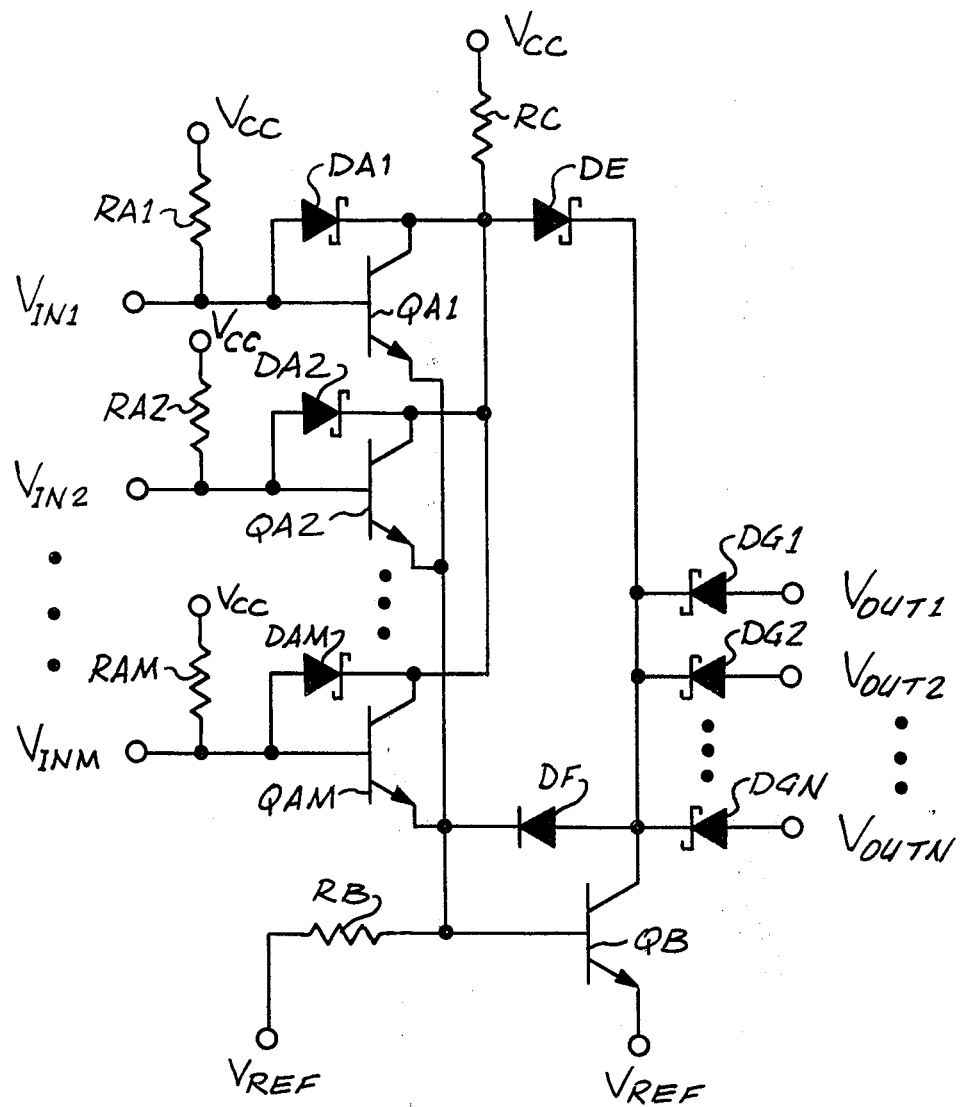
FIG. 6 is a circuit diagram of a NOR logic gate employing the inverter of FIG. 3.

The inverter circuit of the invention is a basic building block for more advanced logic gates. Referring to FIG. 6, it illustrates a multi-input NOR gate employing the basic inverter of FIG. 3. Instead of transistor QA, this NOR gate has M transistors QA1, QA2 ... QAM having their single emitters connected in common to the base of transistor QB and having their single collectors connected in common through resistor RC to source $V_{CC}$. Each transistor QAI where I varies from 1 to M receives a corresponding input signal $V_{INI}$ at its base which is coupled through a corresponding resistor RAI to source $V_{CC}$. Likewise, each transistor QAI is Schottky clamped with a corresponding Schottky diode DAI.

The NOR gate operates basically the same and at the same logical levels as the inverter of FIG. 3. When all voltages $V_{IN1}-V_{INM}$ go to logical "0", transistors QA1–QAM all turn off. Diode DF becomes conductive to provide a current path from source $V_{CC}$ to the base of transistor QB to prevent it from turning off. Each voltage $V_{OUTJ}$ rises to logical "1". When any voltage $V_{INI}$ is raised to logical "1", corresponding transistor QAI turns on to cause diode DF to become non-conductive. Current from source $V_{CC}$ is supplied through this transistor QAI to the base of transistor OB which turns on harder but does not go into deep saturation. Voltage $V_{OUT}$ drops to logical "0".

Figure 7:
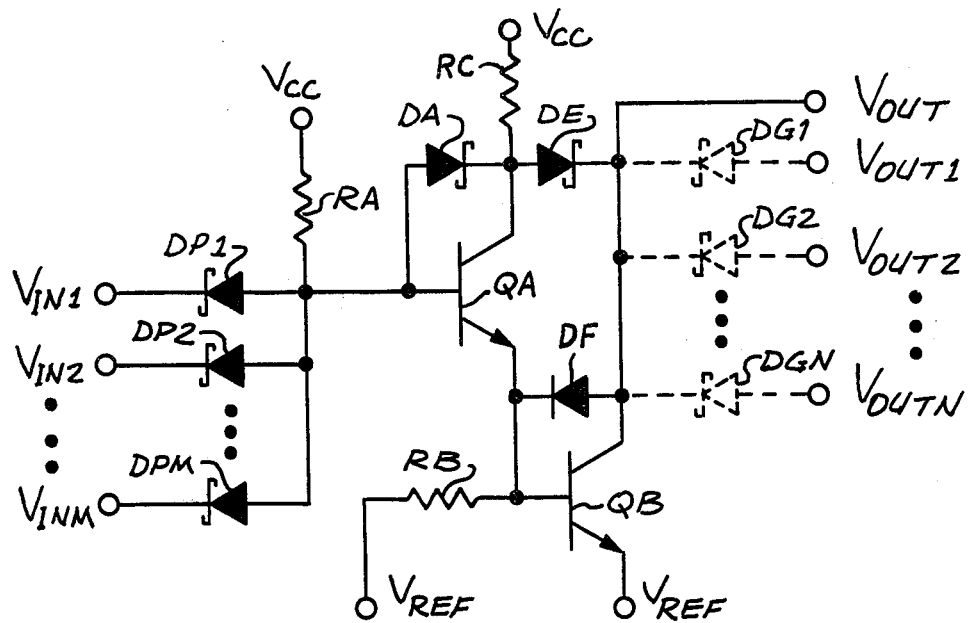
FIGS. 7 and 8 are circuit diagrams of NAND logic gates employing the inverter of FIG. 3.

FIG. 7 shows a multi-input NAND logic gate in which the inverter of FIG. 3 is the basic building block. In this NAND gate, the anodes of M aluminum-silicon input Schottky diodes DP1, DP2, . . . DPM are connected to the base of transistor QA. Each input voltage $V_{INI}$ applied to the cathode of corresponding diode DPI is 1 $V_{SH}$ lower than the voltage ($V_{IN}$ of FIG. 3) at the base of transistor QA when diode DPI is conductive. The output signal, which should also be 1 $V_{SH}$ lower so as to be compatible with other logic gates connected to this NAND gate, is voltage $V_{OUT}$ taken directly from the collector of transistor QB. In some applications—e.g. where this NAND gate is the last of a series of logic gates—it may be desirable or necessary to take the output signal (s) from one or more Schottky diodes connected to the collector of transistor QB. For this reason, FIG. 7 shows diodes DG1–DGN in dotted line form for providing output voltages $V_{OUT1}$–$V_{OUTN}$. Except in unusual situations, the NAND gate normally contains either input diodes DP1–DPM or output diodes DG1–DGN but not both sets of diodes because the set not included forms either the output diodes to a preceding logic gate or the input diodes to a following gate.

The NAND gate of FIG. 7 operates basically the same as the inverter of FIG. 3. The desired logical "0" and logical "1" levels are 2 $V_{BE}-2$ $V_{SH}$ and 2 $V_{BE}+V_{SH}$, respectively. Resistor RA is sized appropriately to match the logical "1" input level. When any voltage $V_{INI}$ is at logical "0", corresponding diode DPI conducts so as to cause a sufficiently large voltage drop across resistor RA to turn transistor QA off. Transistor OB then operates as described above for FIG. 3. When all diodes DP1–DPM are at logical "1", the current through resistor RA decreases to reduce its voltage drop sufficiently to turn transistor QA on. Transistor OB again operates as described for FIG. 3.

Figure 8:
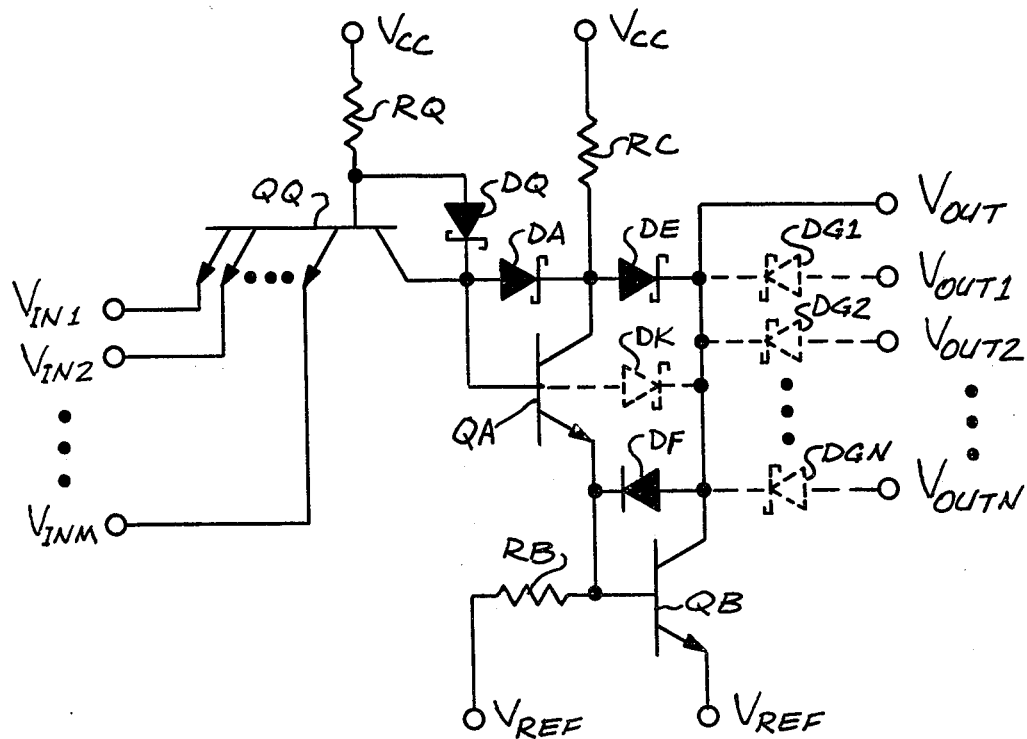

Turning to FIG. 8, it illustrates another multi-input NAND logic gate in which the inverter of FIG. 3 is the basic building block. In addition to the basic elements of FIG. 3, this NAND gate contains a multiple-emitter transistor QQ having its collector connected to the base of transistor QA. The base of transistor QQ is tied to source $V_{CC}$ through a resistor RQ which replaces resistor RA of FIG. 3. A Schottky diode DQ Schottky clamps transistor QQ which has M emitters, each of which receives one of M input signals $V_{IN1}$, $V_{IN2}$, . . . $V_{INM}$. The output signal is normally voltage $V_{OUT}$ from the collector of transistor QA. Diodes DG1–DGN are illustrated in dotted line form for the situations in which the output signal(s) must be higher. Diode DK is also optionally included in the NAND gate to replace diode DA in the manner generally described above for FIG. 5.

Each emitter of transistor QQ functions basically the same as one of input diodes DP1–DPM of the NAND gate of FIG. 7 except that each input voltage $V_{INI}$ is 1 $V_{BE}-1$ $V_{SH}$ lower than the base voltage ($V_{IN}$ of FIG. 3) of transistor QA because transistor QQ is Schottky clamped. Accordingly, the desired logical "1" level is 1 $V_{BE}+1$ $V_{SH}$ at the input and output. The desired logical "0" level is the minimum value of voltage $V_{OUT}$. When diode DK is absent, the desired logical "0" value is 2 $V_{BE}-2$ $V_{SH}$ which is 1 $V_{SH}$ lower than that of FIG. 3. Transistors QA and QB are controlled in the same manner as described above for FIG. 3. The output noise margins are, however, slightly different because of the different logical levels.

When diode DK is present (and diode DA is preferably absent), the desired logical "0" level is 2 $V_{BE}-2$ $V_{SH}$. Transistor QA is controlled in substantially the same manner as described above for FIG. 5. Transistor QB, however, operates somewhat differently. When voltage $V_{OUT}$ goes to logical "1", voltage $V_{BCQB}$ is again $-1$ $V_{BE}$ so that transistor QB operates in the linear range, but, when voltage $V_{OUT}$ goes to logical "0", voltage $V_{BCQB}$ is clamped at 1 $V_{SH}$ higher than described above for FIG. 3 or 5. In particular, voltage $V_{BCQB}$ is 1 $V_{SH}-1$ $V_{BE}$ which is negative so that the base-collector junction of transistor QB is reverse-biased and it does not saturate at all. In short transistor QB always operates in the linear range when diode DK is employed on the NAND gate of FIG. 8. The output voltage swing is 1 $V_{SH}$ which is one half of that in FIG. 3. The output noise margins are likewise about one half of those of FIG. 3.

Table II summarizes the operating characteristics for the NAND gate of FIG. 8.

TABLE II

| DA | DK | $V_{OUT}$ | $V_{BCQA}$ | $V_{BCQB}$ | NOISE MARGIN |
|---|---|---|---|---|---|
| Present | Absent | 0 | $V_{SH}$ | $2V_{SH}-V_{BE}$ | $3V_{SH}-V_{BE}$ |
|  |  | 1 | — | $-V_{BE}$ | $V_{BE}-V_{SH}$ |
| Absent | Present | 0 | 0 | $V_{SH}-V_{BE}$ | $2V_{SH}-V_{BE}$ |
|  |  | 1 | — | $-V_{BE}$ | $V_{BE}-V_{SH}$ |

If transistor QQ has only one emitter (or, equivalently, if all of voltages $V_{IN1}-V_{INM}$ but one are held at logical "1"), the circuit of FIG. 8 functions as an inverter.

Methods for manufacturing the various elements of the present invention are well known in the semiconductor art. Preferably, each logic gate is fabricated according to conventional planar processing techniques using oxide isolation to separate active semiconductor regions.

Figure 9:
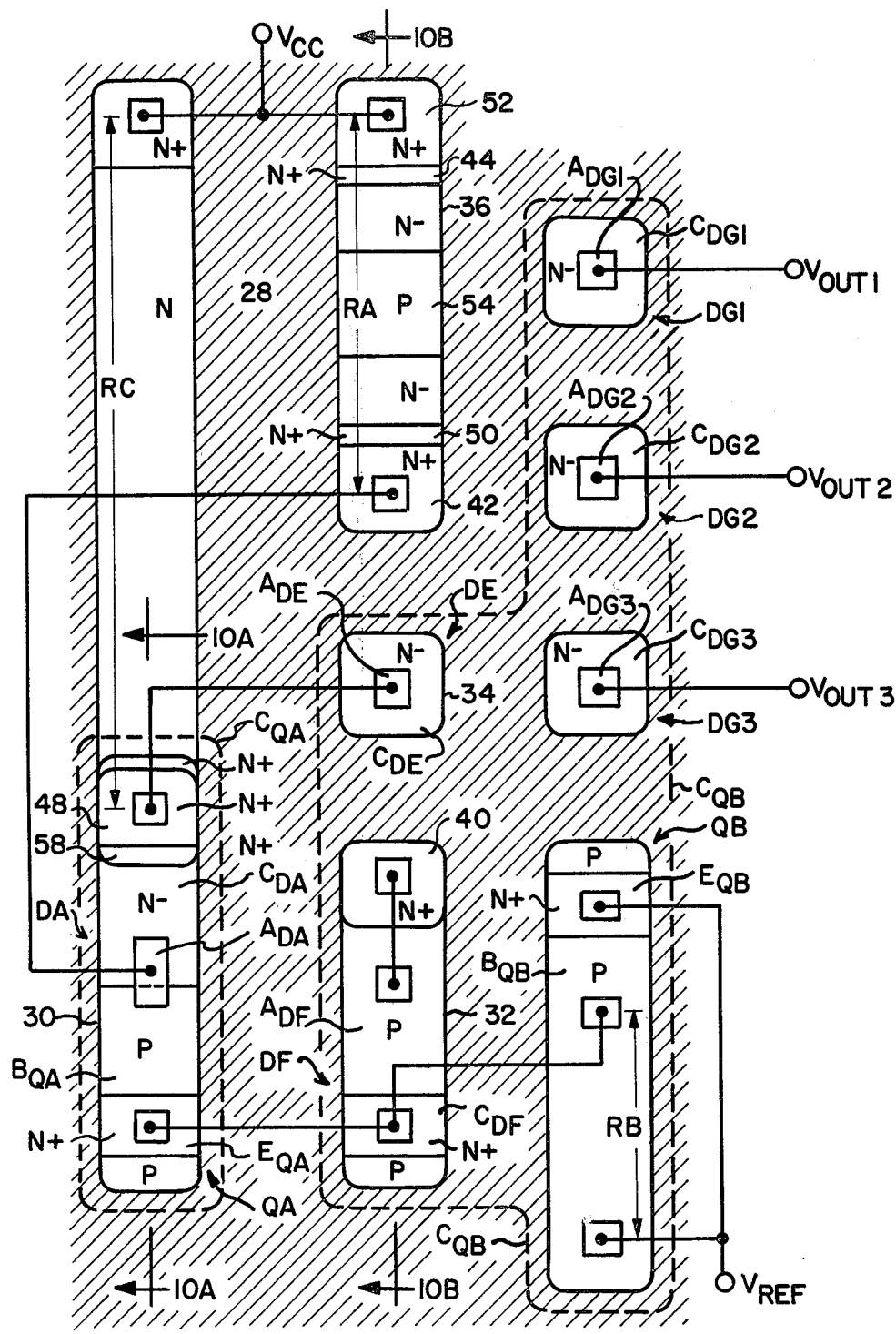
FIG. 9 is a topographical view of the layout of the inverter of FIG. 3.

FIG. 9 shows a plan view for a preferred embodiment of the inverter of FIG. 3 manufactured according to planar techniques using oxide isolation. In particular, FIG. 9 shows the P-type and N-type regions along the top surface of the inverter below overlying insulating material and metallic electrical connections. The overlying insulating material is not shown at all. The area shaded in diagonal lines indicates insulating material separating the various active semiconductor regions from one another. The overlying metallic connections are indicated as thick lines extending from the various contact windows schematically depicted as rectangles or squares. "A" and "C" followed by a subscript which is the symbol for a diode indicate its anode and cathode, respectively. "B", "E", and "C" followed by a subscript which is a symbol for a transistor indicate its base, emitter, and collector, respectively. Three output diodes DG1, DG2, and DG3 are shown in FIG. 9. The size of this inverter is approximately 48 microns by 100 microns.

To further illustrate the construction of the logic gates of the present invention, FIGS. 10A and 10B depict cross-sectional views of portions of the inverter of FIG. 9 The cross-sections are taken through the planes indicated by arrows 10A and arrows 10B in FIG. 9. All of the elements of the inverter of FIG. 3 not shown in FIGS. 10A and 10B as well as all of the other transistors, resistors, diodes, electrical connections, and other elements of the present logic circuit are preferably fabricated in the manner described below.

Conventional masking, etching, and cleaning techniques, which are well known in the art, are employed in creating the various P-type and N-type regions shown in FIGS. 10A and 10B. To simplify the discussion, references to the masking, etching, cleaning and other well-known steps in the semiconductor art are omitted from the following fabrication discussion.

Boron is utilized as the P-type impurity for creating the various regions of P-type conductivity on a semiconductor wafer. Phosphorous, arsenic, and antimony are used selectively as the complementary N-type dopants. Other appropriate impurities may be used in place of these dopants. In many of the diffusion steps, an impurity may alternatively be introduced to the wafer by ion implantation or vice versa.

The starting material is a P-type monocrystalline silicon substrate having a thickness indicated by item 20 and a resistivity of 7–15 ohm-centimeters. An N-type impurity (antimony) is selectively diffused into the upper surface of substrate 20 to form N+ regions 22 and 24 having a depth of 2.5–3.0 microns and a sheet resistance of approximately 25 ohms/square. The N-type portions $C_{QA}$ and $C_{QB}$ of regions 22 and 24, respectively, remaining after subsequent processing steps serve as the collectors for transistors QA and QB, respectively. An N− epitaxial layer having an original thickness of about 1.2 microns indicated by item 26 is then grown over the upper surface of substrate 20 including over N+ regions 22 and 24. Epitaxial layer 26 has an original resistivity of approximately 0.5 ohm-centimeter. Oxide-isolation regions 28 having a depth of about 1.3–1.4 microns are then formed according to conventional techniques through epitaxial layer 26 and partially into substrate 20 to define active semiconductor regions 30, 32, 34, and 36 and electrically isolate them from one another and from other such active semiconductor regions of the wafer.

An N-type impurity (phosphorous) is selectively ion implanted at an energy of 50 kiloelectron volts and a dosage of $1.4 \times 10^{15}$ ions/centimeter$^2$ to define deep N+ regions 38, 40, 42, and 44. A thin electrically insulating layer 46 consisting of silicon dioxide and silicon nitride is then formed at the top of the wafer. The silicon dioxide is 500 angstroms in thickness while the overlying silicon nitride is 700 angstroms in thickness. After selectively etching oxynitride layer 46 to form windows through it, an N-type impurity (arsenic) is diffused into epitaxial layer 26 through these windows to define shallow N+ regions $E_{QA}$, 48, $C_{DF}$, 50, and 52 having a sheet resistance of about 30 ohms/square. A P-type impurity (boron) is then selectively ion implanted at an energy of 50 kiloelectron volts and a dosage of $1.5 \times 10^{14}$ ions/centimeter$^2$ through layer 46 to form P regions $B_{QA}$, $A_{DF}$, and 54. The structure is then annealed for 25–30 minutes at 1000° C. to cause the various impurities to diffuse to the locations generally shown in FIGS. 10A and 10B.

Regions $B_{QA}$ and $E_{QA}$ are the base and emitter, respectively, for transistor QA. The remaining N− portion $C_{DA}$ of epitaxial layer 26 between regions $B_{QA}$ and 38 in island 30 serves as the cathode for diode DA. Deep N+ region 38 in combination with shallow contact N+ region 48 connect the collector $C_{QA}$ of transistor QA to the anode $A_{DE}$ of diode DE. Diode DF is a transistor in which the cathode is emitter region $C_{DF}$ while the anode is base region $A_{DF}$ connected by way of N+ collector region 40 to the collector $C_{QB}$ of transistor QB. The remaining N− portion $C_{DE}$ of epitaxial layer 26 in island 34 is the cathode for diode DE. The remaining N− portion of epitaxial layer 26 in island 36 forms resistor RA. Deep N+ regions 42 and 44 in combination with shallow N+ contact regions 50 and 52, respectively, serve as connections for resistor RA while P region 54 "pinches off" resistor RA to control its resistance.

A pattern of leads indicated by diagonal-line shading is formed according to conventional techniques over the contact windows down to the underlying semiconductor regions, over the remaining portions of insulation layer 46 and over oxide-isolation regions 28 to connect the conductive regions in the desired manner. Each lead consists of a thin lower layer of platinum silicide over the underlying silicon, a thin intermediate layer of titanium-tungsten, and an upper layer of aluminum. Lead $A_{DE}$ forms the anode for diode DE. Lead $A_{DA}$ forms the anode for diode DA and also serves as the electrical connection to base $B_{QA}$ of transistor QA. The structure in FIGS. 10a and 10B is then finished in a conventional manner. In the final structure, resistor RA is 20 kiloohms, resistor RB is 3 kiloohms, and resistor RC is 10 kiloohms. Source $V_{CC}$ is 5.0 volts.

While the invention has been described with reference to particular embodiments, the description is solely for the purpose of illustration and is not be be construed as limiting the scope of the invention claimed below. For example, semiconductor materials of opposite conductivity type to those described above might be employed to accomplish the same results. Thus, various modifications, changes and applications may be made by those skilled in the art without departing from the true scope and spirit of the invention as defined by the appended claims.

What is claimed is:

1. A logic circuit having: a first bipolar transistor having a base for receiving an input signal, an emitter, and a collector coupled to a voltage/current source; and a second bipolar transistor having a base coupled to the emitter of the first transistor, an emitter coupled to a constant voltage source, and a collector coupled to the voltage/current source for supplying an output signal; characterized by plural means for preventing the second transistor from either turning substantially off or normally going into deep saturation.

2. A logic circuit as in claim 1 characterized in that each transistor is an NPN transistor.

3. A logic circuit as in claim 2 characterized in that the means comprise: first means for providing positive current from the voltage/current source in a single current flow direction to the collector of the second transistor; and second means for selectively providing current from the first means in a single current-flow direction to the base of the second transistor.

4. A logic circuit as in claim 3 characterized in that the first means prevents the second transistor from ever going into deep saturation.

5. A logic circuit as in claim 4 characterized in that the first means comprises a first diode having its anode and cathode coupled respectively to the collectors of the first and second transistors.

6. A logic circuit as in claim 5 characterized in that the first diode is a Schottky diode.

7. A logic circuit as in claim 6 characterized in the first means further includes clamping means for preventing the first transistor from normally going into deep saturation.

8. A logic circuit as in claim 7 characterized in that the clamping means comprises a Schottky diode having its anode and cathode connected respectively to the base and collector of the first transistor.

9. A logic circuit as in claim 7 characterized in that the clamping means substantially prevents the first transistor from saturating at all.

10. A logic circuit as in claim 9 characterized in that the clamping means comprises the first diode and a Schottky diode having its anode and cathode coupled respectively to the base of the first transistor and the collector of the second transistor.

11. A logic circuit as in claim 5 characterized in that the second means comprises a second diode having its anode and cathode coupled respectively to the collector and base of the second transistor.

12. A logic circuit as in claim 11 characterized in that the second diode is a PN diode.

13. A logic circuit as in claim 12 characterized in that the second means further includes a Schottky diode in series with the second diode.

14. A logic circuit as in claim 13 characterized in that the first means further includes: a Schottky diode in series with the first diode coupled to its cathode; and a diode having its anode and cathode coupled respectively to the base of the first transistor and the cathode of the first diode.

15. A logic circuit as in claim 2, 3, 4, 5, 6, 7, 8, 9, 10, 11, 12, 13, or 14 characterized in that the output signal is of opposite polarity to the input signal whereby the logic circuit functions as an inverter.

16. A logic circuit as in claim 2, 3, 4, 5, 6, 7, 8, 9, 10, 11, 12, 13, or 14 characterized by (M−1) additional first NPN transistors, where M is a positive integer greater than one, each additional first transistor having a base for receiving an input signal, an emitter coupled to the base of the second transistor, and a collector coupled to the voltage/current source, the logic circuit thereby operable as a NOR gate.

17. A logic circuit as in claim 2, 3, 4, 5, 6, 7, 8, 9, 10, 11, 12, 13, or 14 characterized by a plurality of input diodes coupled through their anodes to a voltage/current source and to the base of the first transistor, the logic circuit thereby operable as a NAND gate.

18. A logic circuit as in claim 2, 3, 4, 5, 6, 7, 8, 9, 10, 11, 12, 13, or 14 characterized by a third NPN transistor having a base coupled to a voltage/current source, at least one emitter for receiving at least one corresponding signal from which the input signal is to be derived, and a collector coupled to the base of the second transistor.

* * * * *